US008510672B2

(12) United States Patent
Loberg

(10) Patent No.: US 8,510,672 B2
(45) Date of Patent: *Aug. 13, 2013

(54) AUTOMATICALLY CREATING AND MODIFYING FURNITURE LAYOUTS IN DESIGN SOFTWARE

(75) Inventor: Barrie A. Loberg, Millarville (CA)

(73) Assignee: Dirtt Environmental Solutions LTD, Calgary (CA)

( * ) Notice: Subject to any disclaimer, the term of this patent is extended or adjusted under 35 U.S.C. 154(b) by 212 days.

This patent is subject to a terminal disclaimer.

(21) Appl. No.: 12/444,886

(22) PCT Filed: Mar. 11, 2009

(86) PCT No.: PCT/CA2009/000311
§ 371 (c)(1),
(2), (4) Date: Jun. 24, 2009

(87) PCT Pub. No.: WO2009/111885
PCT Pub. Date: Sep. 17, 2009

(65) Prior Publication Data
US 2011/0191706 A1      Aug. 4, 2011

Related U.S. Application Data

(60) Provisional application No. 61/035,716, filed on Mar. 11, 2008.

(51) Int. Cl.
*G06F 3/048* (2013.01)
(52) U.S. Cl.
USPC ........... 715/771; 715/765; 715/775; 715/782; 715/793; 715/798; 715/800; 715/835; 715/850; 715/852
(58) Field of Classification Search
USPC .................. 715/765, 768, 771, 775, 782, 793, 715/798, 800, 835, 850, 852
See application file for complete search history.

(56) References Cited

U.S. PATENT DOCUMENTS 5,111,392 A * 5/1992 Malin ............................ 705/29
5,255,207 A   10/1993 Cornwell
(Continued)

FOREIGN PATENT DOCUMENTS

EP   1098244       9/2001
EP   1098244 A2   9/2001
(Continued)

OTHER PUBLICATIONS bing searach q=replicate+hardware+workspace&qs=n&, NPL search, Mar. 23, 2013.*
bing search q=populate+connector+workspace&qs=n&, NPL search, Mar. 23, 2013.*
bing search q=populate+hardware+workspace&qs=n&f, NPL search, Mar. 23, 2013.*

(Continued)

*Primary Examiner* — Namitha Pillai
*Assistant Examiner* — John Heffington
(74) *Attorney, Agent, or Firm* — Workman Nydegger

(57) ABSTRACT

A software application can capture product parameters and attributes in order to allow a non-expert user to create an accurate and complete furniture system layout in a design space. To enable accurate layouts, the software application can automatically apply all applicable components, connectors, rules, attributes, codes, and behaviors to each component/design element in the design space. The intelligent, object-oriented software can automatically recognize required changes effected by a user-driven change, and automatically resolve the layout design by constraining vertical placement of components or automatically generating interconnections between components.

15 Claims, 5 Drawing Sheets

(56) References Cited

U.S. PATENT DOCUMENTS

| | | | |
|---|---|---|---|
| 5,293,479 A | 3/1994 | Quintero et al. | |
| 5,514,232 A * | 5/1996 | Burns | 156/64 |
| 5,555,357 A | 9/1996 | Fernandes et al. | |
| 5,572,639 A | 11/1996 | Gantt | |
| 5,576,965 A | 11/1996 | Akasaka et al. | |
| 5,588,098 A * | 12/1996 | Chen et al. | 345/653 |
| 5,684,713 A * | 11/1997 | Asada et al. | 716/54 |
| 5,740,341 A * | 4/1998 | Oota et al. | 345/420 |
| 5,764,518 A * | 6/1998 | Collins | 700/95 |
| 5,894,310 A * | 4/1999 | Arsenault et al. | 345/679 |
| 5,977,982 A | 11/1999 | Lauzon | |
| 6,014,503 A | 1/2000 | Nagata | |
| 6,037,945 A | 3/2000 | Loveland | |
| 6,459,435 B1 | 10/2002 | Eichel | |
| 6,509,906 B1 | 1/2003 | Awe et al. | |
| 6,662,144 B1 | 12/2003 | Normann et al. | |
| 6,690,981 B1 * | 2/2004 | Kawachi et al. | 700/83 |
| 6,701,288 B1 | 3/2004 | Normann | |
| 6,721,684 B1 * | 4/2004 | Saebi | 702/183 |
| 6,772,168 B2 | 8/2004 | Ardoin et al. | |
| 6,888,542 B1 | 5/2005 | Clauss | |
| 6,922,701 B1 | 7/2005 | Ananian | |
| 6,985,832 B2 * | 1/2006 | Saebi | 702/189 |
| 6,999,102 B2 | 2/2006 | Felser et al. | |
| 7,042,440 B2 * | 5/2006 | Pryor et al. | 345/158 |
| 7,062,722 B1 * | 6/2006 | Carlin et al. | 715/850 |
| 7,246,044 B2 * | 7/2007 | Imamura et al. | 703/1 |
| 7,249,005 B2 | 7/2007 | Loberg | |
| 7,266,768 B2 * | 9/2007 | Ferlitsch et al. | 715/273 |
| 7,277,572 B2 * | 10/2007 | MacInnes et al. | 382/154 |
| 7,277,830 B2 | 10/2007 | Loberg | |
| 7,643,966 B2 * | 1/2010 | Adachi et al. | 703/1 |
| 7,661,959 B2 * | 2/2010 | Green et al. | 434/75 |
| 7,676,348 B2 | 3/2010 | Okada | |
| 7,822,584 B1 * | 10/2010 | Saebi | 703/1 |
| 7,877,237 B1 * | 1/2011 | Saebi | 703/1 |
| 8,185,219 B2 * | 5/2012 | Gilbert et al. | 700/83 |
| 2001/0024211 A1 * | 9/2001 | Kudukoli et al. | 345/763 |
| 2001/0047250 A1 | 11/2001 | Schuller | |
| 2002/0069221 A1 * | 6/2002 | Rao et al. | 707/509 |
| 2002/0083076 A1 | 6/2002 | Wucherer | |
| 2002/0091739 A1 * | 7/2002 | Ferlitsch et al. | 707/526 |
| 2002/0093538 A1 | 7/2002 | Carlin | |
| 2002/0144204 A1 | 10/2002 | Milner | |
| 2002/0196285 A1 * | 12/2002 | Sojoodi et al. | 345/771 |
| 2004/0012542 A1 | 1/2004 | Bowsher | |
| 2004/0098691 A1 | 5/2004 | Teig | |
| 2004/0117746 A1 | 6/2004 | Narain et al. | |
| 2004/0145614 A1 | 7/2004 | Takagaki et al. | |
| 2004/0204903 A1 * | 10/2004 | Saebi | 702/167 |
| 2005/0041028 A1 * | 2/2005 | Coutts | 345/441 |
| 2005/0065951 A1 | 3/2005 | Liston | |
| 2005/0071135 A1 | 3/2005 | Vredenburgh | |
| 2005/0081161 A1 | 4/2005 | MacInnes | |
| 2006/0028695 A1 | 2/2006 | Knighton | |
| 2006/0041842 A1 | 2/2006 | Loberg | |
| 2006/0174209 A1 * | 8/2006 | Barros | 715/764 |
| 2006/0206623 A1 | 9/2006 | Gipps et al. | |
| 2006/0271378 A1 | 11/2006 | Day | |
| 2007/0115275 A1 * | 5/2007 | Cook et al. | 345/418 |
| 2007/0180425 A1 | 8/2007 | Storms | |
| 2007/0188488 A1 | 8/2007 | Choi | |
| 2007/0204241 A1 * | 8/2007 | Glennie et al. | 715/964 |
| 2007/0219645 A1 | 9/2007 | Thomas et al. | |
| 2007/0240049 A1 | 10/2007 | Rogerson et al. | |
| 2007/0250295 A1 * | 10/2007 | Murray et al. | 703/2 |
| 2007/0260432 A1 | 11/2007 | Okada | |
| 2007/0271870 A1 | 11/2007 | Mifsud et al. | |
| 2008/0036769 A1 * | 2/2008 | Coutts | 345/441 |
| 2008/0052618 A1 * | 2/2008 | McMillan et al. | 715/249 |
| 2008/0143884 A1 * | 6/2008 | Foster et al. | 348/722 |
| 2008/0275674 A1 * | 11/2008 | Reghetti et al. | 703/1 |
| 2008/0303844 A1 * | 12/2008 | Reghetti et al. | 345/629 |
| 2008/0309678 A1 * | 12/2008 | Reghetti et al. | 345/635 |
| 2009/0119039 A1 | 5/2009 | Banister et al. | |
| 2009/0138826 A1 * | 5/2009 | Barros | 715/841 |
| 2009/0148050 A1 * | 6/2009 | Reghetti et al. | 382/219 |
| 2009/0273598 A1 * | 11/2009 | Reghetti et al. | 345/419 |
| 2010/0017733 A1 * | 1/2010 | Barros | 715/766 |
| 2010/0121614 A1 * | 5/2010 | Reghetti et al. | 703/1 |
| 2010/0138762 A1 * | 6/2010 | Reghetti et al. | 715/765 |
| 2011/0078169 A1 | 3/2011 | Sit | |

FOREIGN PATENT DOCUMENTS

| | | |
|---|---|---|
| EP | 1204046 | 5/2002 |
| JP | EP1204046 A1 | 5/2002 |
| WO | WO9003618 | 4/1990 |
| WO | WO9003618 A1 | 4/1990 |
| WO | WO9322741 | 11/1993 |
| WO | WO9322741 A2 | 11/1993 |
| WO | WO02075597 | 9/2002 |
| WO | WO2005033985 | 4/2005 |
| WO | WO2006018744 | 2/2006 |
| WO | WO2006018744 A2 | 2/2006 |
| WO | WO2007093060 | 8/2007 |
| WO | WO2007093060 A1 | 8/2007 |
| WO | 2007106873 | 9/2007 |
| WO | 2009100538 | 8/2009 |

OTHER PUBLICATIONS bing search q=replicate+connector+workspace&qs=n, NPL search, Mar. 23, 2013.*
International Search Report and Opinion on PCT/CA2007/000241, mailed May 15, 2007.
International Search Report and Opinion on PCT/CA2009/000190, mailed Jun. 5, 2009.
International Search Report and Opinion on PCT/CA2009/000183, mailed Jun. 9, 2009.
International Search Report and Opinion on PCT/CA2009/000311, mailed Jul. 30, 2009.
Office Action Mailed Aug. 18, 2010, U.S. Appl. No. 11/577,302.
Chan, et al.: "Design of a Walkthrough System for Indoor Environments from Floor Plans"; Proceedings of the 1998 IEEE Conference on Information Visualization, Jul. 29-31, 1998, pp. 50-57.
Office Action Mailed Oct. 18, 2006, U.S. Appl. No. 11/204,419.
Office Action Mailed Oct. 19, 2006, U.S. Appl. No. 11/204,420.
Office Action Mailed Nov. 28, 2007, U.S. Appl. No. 11/204,421.
Office Action Mailed Aug. 11, 2008, U.S. Appl. No. 11/204,421.
Office Action Mailed Dec. 23, 2008, U.S. Appl. No. 11/204,421.
Advisory Action Mailed Mar. 31, 2009, U.S. Appl. No. 11/204,421.
Advisory Action Mailed May 15, 2009, U.S. Appl. No. 11/204,421.
Edward J. Dejesus, James P. Callan, and Curtis R. Whitehead, Pearl: An Expert System for Power Supply Layout, 23rd Design Automation Conference, Paper 34.4, IEEE.
Josie Wernecke; Title: The Inventor Mentor: Programming Object Oriented 3D Graphics with Open Inventor; Release 2; Date: Jun. 19, 1997; Published on Web Site: www.cs.ualberta.cal-.
Edward J. Dejesus, James P. Callan, and Curtis R. Whitehead, Pearl: An Expert System for Power Supply Layout, 2rd Design Automation Conference, Paper 34.4, IEEE.
Office Action Mailed Mar. 31, 2009, U.S. Appl. No. 11/204,421.
Office Action Mailed May 15, 2009, U.S. Appl. No. 11/204,421.
Office Action Mailed Jul. 29, 2009, U.S. Appl. No. 11/204,421.
USPTO, Office Action in U.S. Appl. No. 12/444,886, mailed Oct. 27, 2011, 24 pages.
International Search Report & Written Opinion for PCT/US2010/058092 dated Jul. 27, 2011.
USPTO, Office Action in U.S. Appl. No. 12/444,890, mailed Oct. 27, 2011, 30 pages.
Marir F et al: "OSCONCAD: a model-based CAD system integrated with computer applications", Proceedings of the International Construction IT Conference, vol. 3, 1998.
EPO Search Report for EP07701791 dated Aug. 21, 2012.
USPTO, Office Action in U.S. Appl. No. 12/444,893 mailed Feb. 19, 2013.
International Search Report for PCT/CA2009000190 mailed Apr. 12, 2012.

* cited by examiner

AUTOMATICALLY CREATING AND MODIFYING FURNITURE LAYOUTS IN DESIGN SOFTWARE

CROSS-REFERENCE TO RELATED APPLICATIONS

The present invention is a U.S. National Stage Application corresponding to PCT/CA2009/000311, filed on Mar. 11, 2009, entitled "Automatically Creating and Modifying Furniture Layouts in Design Software," which claims the benefit of priority to U.S. Provisional Patent Application No. 61/035,716, filed on Mar. 11, 2008, entitled "Automated Layout for Space Planning and Specification of Configurable Furniture in Object Oriented Design Software." Each of the aforementioned patent applications is incorporated by reference herein in its respective entirety.

BACKGROUND OF THE INVENTION

1. Technical Field

The present disclosure relates generally to software used for modeling and designing interior or exterior spaces.

2. Background and Relevant Art

As computerized systems have increased in popularity, so has the range of applications that incorporate computational technology. For example, architects and interior designers (or "designers") use a wide range of design software for designing the aesthetic as well as functional aspects of a given residential or commercial space. While conventional software design programs (e.g., computer-aided design or CAD programs) offer significant benefits over rudimentary drafting, they still nonetheless present various drawbacks.

For instance, conventional software design programs typically require a designer to place components in a specific order, generally one component at a time, or in a linear repetition of product assemblies. This can lead to various inefficiencies if the designer desires to change or modify a design layout. For example, if a designer desires to resize, change product lines, connect separate assemblies, or otherwise reconfigure a design space, conventional software programs require the designer to manually remove and replace the individual components and connectors. One will appreciate that this process is time consuming and does not leverage any pre-work performed earlier in the design phase.

Additionally, conventional design software typically has little if any product intelligence. In most cases, for example, the designer needs to provide information regarding which products may be used together, how those products behave together, and which connection components are required to secure the products together. This often means that the designer needs to remember every part and piece related to the products placed in the context of the layout. Thus, the accuracy, speed of layout creation, and validity of layouts designed using conventional design software are typically dependent upon the skill of the designer.

One will appreciate that conventional design software's dependency upon the skill of the designer can lead to various mistakes and inefficiencies. For example, typical design software can allow spaces to be fairly configurable to suit the designer's design intent without specific regard in many cases to whether the design will actually function or contain all of the necessary parts and components. One will appreciate that even product experts can err when attempting to remember all aspects of any particular component, and can fail to remember or identify a component's relationships with respect to other parts of the layout. For example, a designer may forget to include some of the connection components needed to attach two products together or even use improper connection components.

One of the problems with many conventional design software programs that can lead to the design of physically or functionally impractical structures, is that many such design software programs allow for design only within a space in flat, two-dimensional space or plan view. One will appreciate that because plan views emphasize primarily only length and width from above, the designer will either need to independently visualize the vertical relationship between components, or will need to perform a separate three-dimensional rendering of the design, if the software allows for such. Indeed, conventional design software typically requires the designer to manually enter in the exact vertical coordinates at which a component is to be placed. This often leads to a designer placing components at incorrect vertical heights, or even vertically overlapping components.

To compound this drawback, the designer will often not detect the vertical misplacement of components until after completing the design. For example, the designer may use another program to produce a three-dimensional rendering of a completed design layout. Upon reviewing the three-dimensional rendering of the design layout, the designer may discover the vertically misplaced components. Conventional design software typically requires changes to the design layout or changes in component selection and placement to be made manually, which often results in a complete rework to ensure the designer captures all of the needed changes. For example, changing existing design layouts can involve not only the manual placement of components, but also various considerations related to the changing of the walls, furniture, or other design components.

BRIEF SUMMARY OF THE INVENTION

Implementations of the present invention overcome one or more problems in the art with systems, methods, and computer program products configured to increase the accuracy, speed of creation, and validity of design layouts, while also reducing dependency upon the skill of the user. For example, one or more implementations of the present invention interpret the starting point and direction of user input to select and configure an interconnection type between components in the design space, and automatically populate all applicable connectors and bracketry. Furthermore, implementations of the present invention automatically associate product parameters and attributes to design components, including all applicable connectors, rules, features, characteristics, and behaviors. Based upon the components and their associated attributes and parameters, implementations of the present invention can automatically constrain at least the vertical positioning of components within a design space.

For example, in accordance with an implementation of the present invention a method of automatically configuring and capturing a user's design intent regarding the layout of furniture components within a design space based on one or more user gestures can involve identifying the placement of a first furniture component within a design space. The method can further involve receiving an initial user input indicating at least one drawing start point. Also, the method can involve receiving a subsequent user input indicating a drawing direction from the at least one drawing start point. Additionally, the method can involve placing an additional furniture component within the design space at a location based upon the position of the at least one drawing start point and the drawing direction. Furthermore, the method can involve automatically configuring an interconnection type between the first furniture component and the additional furniture component based upon the position of the at least one drawing start point and the drawing direction.

Additionally, a method in accordance with an implementation of the present invention of automatically configuring user input in a computerized environment to automatically positioning a user's two-dimensional design choices of furniture components in an appropriate vertical layout within a design space can involve receiving user input regarding the placement of one or more furniture components at a first lateral position and a first longitudinal position within a design space. The method can also involve identifying one or more attributes and product parameters associated with the one or more furniture components. The method can additionally involve receiving user input regarding the placement of an additional furniture component at the first lateral position and the first longitudinal position within the design space.

The method can further involve identifying one or more attributes and product parameters associated with the additional furniture component. Additionally, the method can involve constraining the vertical position of the additional furniture component based at least partially upon the one or more attributes and product parameters associated with the additional furniture component and the one or more attributes and product parameters associated with the one or more furniture components.

In addition to the foregoing, a method in accordance with an implementation of the present invention of automatically resolving user input with respect to furniture components in a design space so that the furniture components are accurately depicted, arranged, and associated with appropriate assembly components can involve identifying the placement of a furniture component within a design space. The method can also involve displaying one or more grips about the furniture component. Furthermore, the method can involve receiving user input regarding the movement of the one or more grips from a default location to a new location. Additionally, the method can involve automatically resolving the furniture component by modifying a dimension of the furniture component to reflect a design intent indicated by the movement of the one or more grips. Furthermore, the method can involve automatically modifying one or more design components adjacent to the furniture component.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. One will appreciate that elements of similar structures or functions are generally represented by like reference numerals for illustrative purposes throughout the Figures. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1A:
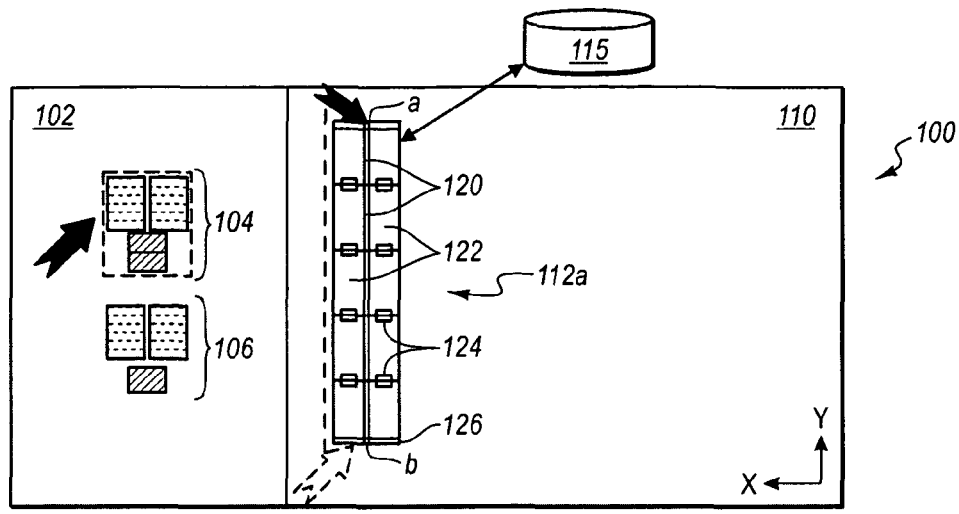
FIG. 1A illustrates a conceptual diagram of a user interface and one or more components of a design software program when a user enters input into a design space in accordance with an implementation of the present invention.

The present invention extends to systems, methods, and computer program products configured to increase the accuracy, speed of creation, and validity of design layouts, while also reducing dependency upon the skill of the user. For example, one or more implementations of the present invention interpret the starting point and direction of user input to select and configure an interconnection type between components in the design space, and automatically populate all applicable connectors and bracketry. Furthermore, implementations of the present invention automatically associate product parameters and attributes to design components, including all applicable connectors, rules, features, characteristics, and behaviors. Based upon the components and their associated attributes and parameters, implementations of the present invention can automatically constrain at least the vertical positioning of components within a design space.

One will thus appreciate that because the systems, methods, and computer program products of the present invention include design components that include associated product attributes and parameters, a non-expert can easily and efficiently create accurate, complete furniture design layouts. Furthermore, implementations of the present invention can apply rules and behaviors and interpret design intent automatically, not only providing an accurate layout, but also allowing change at any time without rework. Implementations of the present invention can also recognize required changes effected by user driven changes, and automatically resolve the design layout, including required component substitutions and dimensional changes, to help maintain validity.

Along similar lines, one or more implementations of the present invention provide software that can recognize required changes affected by the user-driven change, and re-solve the layout design to automatically include required component additions, component substitutions, and/or dimensional changes effected by the user driven design change. The design software system can change product types (e.g., from one furniture product line to another, with its own set of independent behaviors and product rules), and resolve to the new product and its relative behaviors and rules. An auto-solve function in the design software system can identify areas of conflict in the design and either solve the conflicts automatically, or provide choices for the correction. The design software system can also implement the selected solution automatically (e.g., once the end-user has made a choice).

The design software system can align related components, such as work-surfaces and wall panel dividers, on-module or along matching seams. A user can align components generally designed in the default layout condition, or off-module (staggered seams), by highlighting the component and moving a grip. The user can move the grip in any direction within the behavior and rule constraints of the product, allowing the seam placement apart from the seams of the other component types where allowed by product behavior and rules. For auto-layout functionality, the design software system can set particular components (e.g., work surface) to drive the dimensions of adjacent components (e.g., wall panel divider segments) or vice versa. In this manner, the user can determine which component is most important to the design, and the design software system will resize related components accordingly.

Generally, a user can create layouts in a two-dimensional plan view, although users need not work in a linear sequential manner. In most cases, the user is free to design in any manner they wish, and the design software system will understand the design intent and resolve the design accordingly. Additionally, implementations of the present invention can represent the design space in three-dimensional graphics. Thus, a user can easily and quickly toggle between different views or representations to gain a complete understanding of the design space and design components therein. The design software system can create each of these separate views using the same dataset. Thus, one will appreciate that implementations of the present invention can eliminate the need to audit between information sources. Furthermore, because each representation can be based on the same dataset, the design software system can instantly and simultaneously resolve and modify all representations.

Furthermore, through the use of an object-oriented programming language (e.g., Java), the design software system can create programming objects for each component, attribute, option, relationship, and behavior. The design software system can store these objects within a single data structure. Additionally, the design software system can cause each object, in turn, to resolve itself in the design. The design software system can thus appropriately propagate user input at any level of this dataset to all objects in the data structure, thereby resolving the complete design through the resolving of each object individually. In addition, implementations of the present invention can include a solution level programming object, which recognizes behaviors and relationships between objects within the design. As also discussed above, the solution-level programming object can also resolve itself with each user input.

In particular, at any time before, during, or after design layout of any componentry, a user can open a separate three-dimensional interface (or textual interface, such as a Bill of Materials, Order Proposal, reports, etc.). Upon the opening of such an interface (and dynamically in unison with additional user input), the physical component objects can be automatically represented by three-dimensional views, and/or via a textual depiction in the appropriate interface. These interfaces update accordingly with each user input, as each component resolves itself. Other non-physical component objects (e.g., a product price) will also resolve themselves in accordance with related objects, and may or may not be represented in one or more of the graphical or textual interfaces.

As mentioned above, implementations of the present invention can allow non-expert users to efficiently, quickly, and accurately design a layout within a design space. Implementations of the present invention provide specific functionality for furniture system type (or similar) layout design. One will appreciate, however, that a user can use the systems, methods, and computer product programs of the present invention to create layouts of other design components, such as for example, structural building components and functional building systems.

In at least one implementation, the system, methods, and computer products of the present invention allow a user to select various design components from a product menu, which the user can then add to a design space. One will appreciate that a user can also select the design components from a product menu, or the user can import them into the design software system from another software program. For example, FIG. 1A illustrates an exemplary user interface 100 for a design software system in accordance with an implementation of the present invention. As shown in FIG. 1A, the user interface 100 can comprise a plan view interface defined by a lateral or "x" direction and a longitudinal or "y" direction. One will appreciate in light of the disclosure herein, that this is just one example of a user interface of the present invention. For example, additional or alternative implementations of the present invention can include three-dimensional interfaces (FIG. 1E) and textual interfaces.

As shown in FIG. 1A, the user interface 100 can provide a user with a selection portion or toolbar 102 with a list of images or icons (e.g., 104, 106). The icons can represent components, connectors, assemblies, etc. that a user can add to a design space. The icons can represent items that the user can place in a design space 110 portion of the user interface 100. In at least one implementation, the icon is a symbol representing the item. In alternative implementations, the icon can include an image associated with the item. Thus, the icons 104, 106 can provide the user with some initial information about the components, connectors, assemblies, etc. that the user can add to the design space 110.

Of course, the options provided to the user are not limited to the icons shown, necessarily. For example, the design software system can provide the user with other options (not shown) as part of the design program for modifying or replacing the type of component, connector, assembly, etc. In particular, the user may make choices to change the color, material, size, texture, thickness, and so forth of the components, connectors, assemblies, etc. Additionally, the user can change make choices to change or replace the component, connector or assembly in its entirety.

As mentioned previously, one or more implementations of the present invention can help increase the accuracy and creation speed of design layouts. For example, in addition to drawing or adding individual components (wall dividers, cabinets, work surfaces, etc.) to the design space 110, a user can add assemblies and subassemblies of components. For example, FIG. 1A shows that the user selects the icon 104 representing a wall panel divider with work surfaces on both sides. The design software system can treat this product or combination of products as an "idea starter," or set of basic default component(s). The design software system can modify the default components to the user's specific requirements later, or can otherwise leave the default components as selected. For example, as mentioned the user can choose an icon 104 representing a double-sided, rectangular work-surface with a fabric covered divider panel. The user can change the work-surface substrate, size, shape, or finish any time later, along with the height, type or finish of the divider panel. Of course, in at least one implementation, the design software system can apply the defaults inherent to the selected product type when in the initial layout.

Once the icon and associated product type is selected, the user can draw a single line to represent a length, or run, of the product. For example, FIG. 1A illustrates that the user draws a line from point "a" to point "b." Once the user draws the line, the design software system can automatically populate the associated product(s) and component(s). For example, as illustrated in FIG. 1A, the design software system can automatically populate a product assembly 112a including wall dividers 120 and work surfaces 122, on both sides thereof. The design software system can also automatically populate all necessary connectors and bracketry to connect and support the components of the product assembly. Thus, FIG. 1A shows that the design software system can generate the necessary brackets 124 and end supports 126 to connect and support the product assembly 112a.

One will appreciate in light of the disclosure herein that the capability to draw or introduce an entire product assembly 112a to the design space 110 can increase the speed at which a user can create a design layout. For example, the user need not create each individual component in a linear fashion (i.e., first place a panel divider, then bracketry, then work surfaces). Furthermore, the ability to create an entire product assembly 112a can reduce or eliminate the need for a user to know how individual parts and components (i.e., work surfaces 122 and panel dividers 120) interrelate, and which connectors and bracketry (i.e., brackets 124 and end supports 126) are needed to connect and support the components of the product assembly 112a.

In addition or alternatively, the user can import the design components/assemblies into the design space 110 from a separate software program, such as for example, a CAD program. According to some implementations of the present invention, the design components can be resolvable software objects (as used in object-oriented programming). As part of importing design components/assemblies into the design space 110 from a separate software program, implementations of the present invention can provide one or more mechanisms for automatically and instantly rendering record-based data (e.g., linear or sequential database entries representing graphical entities in a computer-aided drawing/design (or CAD application, as well as correlating such data to detailed, object-oriented entities (or "intelligent software objects"). This translation/rendering/linking/correlating can be accomplished and mediated at least in part through the use of one or more intermediate interface components configured to correlate record-based changes with object entities in an object-oriented database.

In either case, as the user enters input corresponding to the placement or importation of the product assembly 112a into the design space 110, the design software system can receive the input and identify the components. In particular, the design software system can identify each component's location, type, size, relationships to other components, etc. Upon identification of the components, the design software system can create intelligent, automatically resolvable objects for each component that includes one or more attributes and product parameters. For example, FIG. 1A illustrates an object database 115 comprising objects for each design component and assembly (e.g., 120, 122, 124, 126, 112a) in the design space 110.

The design software system can create and compile such objects in virtually any object-oriented programming language, including, for example, an object-oriented programming language such as the JAVA programming language. No matter how created, the design software system can store the objects within a single data structure, and resolve each object (where applicable) in the design to conform to the given design intent. The design software system can thus appropriately propagate user input at any level of this dataset to all objects in the data structure consistent with the design intent, thereby resolving the complete design through the resolving of each object individually. These programming objects can include components (e.g., 120, 122) as well as product assemblies 112a.

As mentioned above, each object in the object database 115 can include one or more attributes and product parameters, or reference to one or more databases comprising information of the same. Attributes can include product features and characteristics, such as, for example, size, shape, color, type, texture, price, material composition, etc. Product parameters can include rules and behaviors associated with each component. For example, the rules and behaviors can include the type and number of connectors and bracketry needed to support each component or assembly, how the components and assemblies interact with other design elements, applicable codes, manufacturing guidelines, and physical limitations.

Based on the product attributes and parameters associated with each component and assembly, the design software system can aid a user in the creation of a design layout that is both complete and accurate. For example, the design software system can constrain the length of the product assembly 112a to correspond with the limitations of the actual product to be manufactured and installed. If the product components can be manufactured parametrically in nature (e.g., to any dimensional value), the design software system will allow the user to draw the line representing product assembly 112a to any length.

On the other hand, if the product components are incremental in nature, such as available in 6" increments only, the design software system will only allow the user to draw the line representing the product assembly 112a to lengths of 6" increments. In such a case, a line longer than 6" may represent many adjacent modules of the selected product. For example, even though a work-surface product may not be manufactured longer than 48" the user can draw a line of any length, and the design software system will repeat and connect modules of the product together, as shown in FIG. 1A.

Figure 1B:
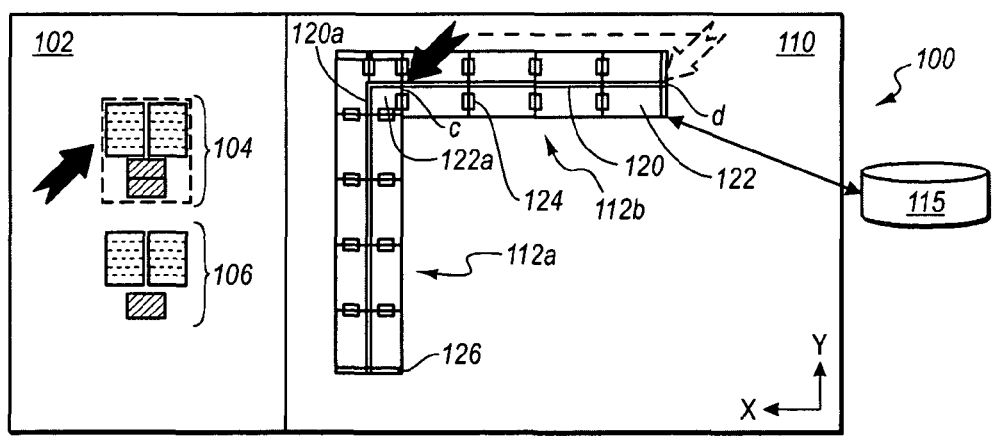
FIG. 1B illustrates a conceptual diagram of the user interface of FIG. 1A in which the design software program interprets user input to select and configure an interconnection type between components in the design space in accordance with an implementation of the present invention.

As mentioned previously, implementations of the present invention can aid a user in the creation of a complete and accurate design layout by interpreting user input indicating a user's design intent for an interconnection type between design components, and automatically populating the interconnection between design components. For example, FIG. 1B illustrates that a user can select icon 104 and draw a line to represent a length, or run, of the product. For example, FIG. 1B illustrates that the user draws a line from a drawing start point "c," along a drawing direction, to point "d." The design software system automatically populates the product assembly 112b, including wall dividers 120 and work surfaces 122 on both sides thereof. The design software system also automatically populates all the necessary connectors and bracketry to connect the product assembly 112b. Thus, FIG. 1B shows that the design software system generates the necessary brackets 124 and end supports 126 to connect and support the components of the product assembly 112b. The design software system also automatically creates and associates objects including attributes and product parameters with each of the components of the additional product assembly 112b.

Furthermore, based on the position of the drawing start point and the drawing direction, the design software system can automatically determine which type of interconnection to generate between the product assembly 112a and the new product assembly 112b. For instance, FIG. 1B illustrates that the user selects a drawing start point "c" adjacent the lateral most edge of work surface component 122a and indicates a drawing direction toward point "d" (in this case a rightward direction). Based on this positioning of the drawing start point and the drawing direction, the design software system automatically generates an "L-corner" joint or interconnection between the product assembly 112a and the newly added product assembly 112b. As shown in FIG. 1B, the L-corner interconnection can include an abutment of work surfaces of the product assembly 112a and the newly added product assembly 112b in an "L" configuration with applicable connectors, bracketry, and supports.

As part of generating the L-corner interconnection, the design software system, can automatically add, remove, or modify the parts and components of one or both of the product assembly 112a and the additional product assembly 112b to facilitate the generation of the interconnection type. For example, FIG. 1B illustrates that design software program can automatically shorten the length or run of the panel divider 120a, and can automatically divide the work surface 122a into two separate components. This allows the generation of an L-corner interconnection between the product assembly 112a and the additional product assembly 112b.

Furthermore, the modifications to the panel divider 120a and the work surface 122a also help maintain the user's design intent of having a panel divider with work surfaces on both sides. In addition to automatically adding, removing, or modifying design components to facilitate the generation of the interconnection type, the design software system can also automatically populate any necessary connectors and bracketry to form the interconnection. For example, FIG. 1B illustrates that the design software system automatically populates brackets 124 between the work surfaces 122 of the product assembly 112a and the additional product assembly 112b.

Figure 1C:
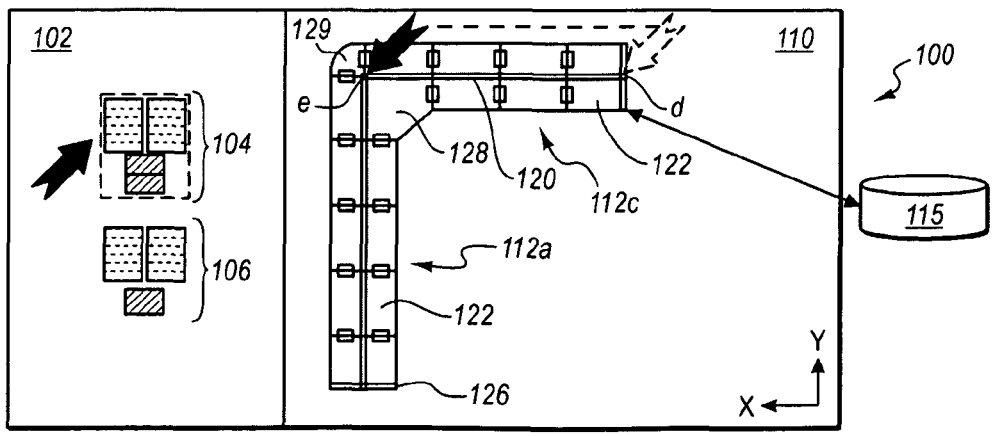
FIG. 1C illustrates a conceptual diagram of the user interface of FIG. 1A in which the design software program interprets user input to select and configure another interconnection type between components in the design space in accordance with an implementation of the present invention.

As mentioned previously, the type of interconnection generated by a design software system can be dependent upon certain user "gestures," representing input indicating a drawing's start point and a drawing direction. For example, FIG. 1C illustrates that a user draws a line (or "gestures") in such a way that flows from drawing start point "e" near the center of the product assembly 112a towards point "d" (or downward in this example). Based on this positioning of the drawing start point and the drawing direction, the design software system automatically identifies the particular gesture, and generates an angled corner interconnection between the product assembly 112a and the newly added product assembly 112c. As shown in FIG. 1C, the angled corner interconnection can include an angled or cornered work surface 128 with applicable connectors, bracketry, and supports.

In the illustrated case, the user's gesture including the placement of the drawing starting point "e" and downward gesture toward point "d" causes the design software system to automatically add a rounded corner work surface 129 and an angled corner work surface 128 to facilitate the angled interconnection between the product assembly 112a and the product assembly 112c. In addition, and as previously discussed with respect to FIGS. 1A and 1B, the design software system can also automatically populate any necessary connectors and bracketry to form the interconnection using the user's gesture in FIG. 1C. For example, FIG. 1C illustrates that the design software system automatically populates brackets 124 between the work surfaces 122 of the product assembly 112a and the additional product assembly 112c.

One will appreciate that the design software system's ability to generate various interconnection types between design components based upon the gesturing of user input (i.e., positioning of a drawing start point and drawing direction) can increase the speed at which a user can create a design layout. For example, the user need not remove and add the necessary individual components in a linear fashion to create the interconnection. Furthermore, the ability to generate various interconnections based on user input can reduce or eliminate the need for a user to know how individual parts and components inter-relate, and which connectors and bracketry are needed to form a particular type of interconnection between design components. By reducing or eliminating some dependency upon a user, the design software system can reduce or eliminate at least some human error and help ensure that design layouts are accurate. Additionally, by having the type of interconnection based upon the gesturing of user input, the design software system can help ensure that a user's design intent is maintained.

One or more implementations of the present invention can also help increase the accuracy, speed of creation, and validity of furniture design layouts by constraining the vertical positioning of design components. (This is in contrast to conventional software that can require a user to input the exact vertical coordinates of each design component.) By associating attributes and product parameters with each design component and assembly, implementations of the present invention can constrain the vertical placement of design components to valid locations. This can reduce the need for the user to know exact vertical coordinates for each design component added to the design space. One will appreciate that this can help increase speed and accuracy of design layouts and reduce human error.

Figure 1D:
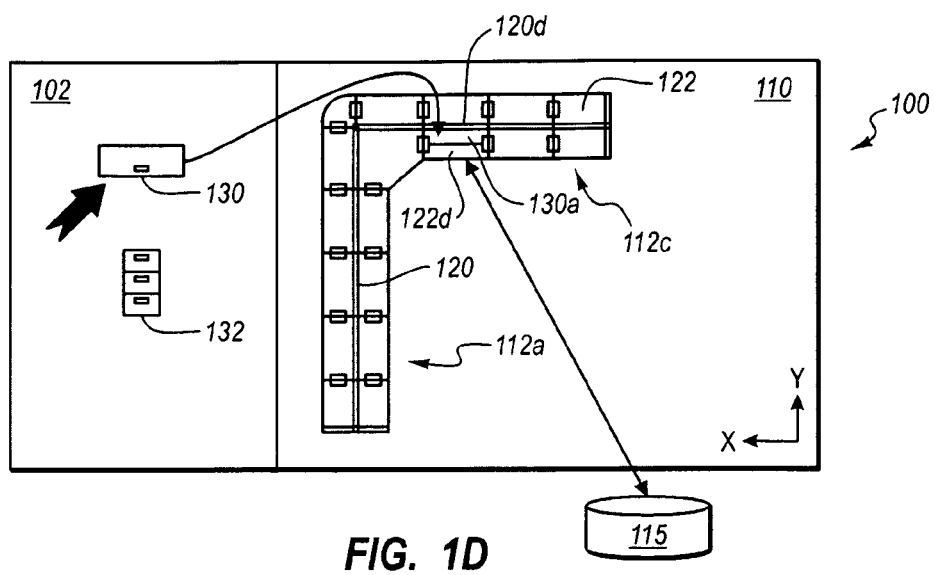
FIG. 1D illustrates a conceptual diagram of the user interface of FIG. 1C in which the design software program automatically constrains the vertical position of one or more components within the design space in accordance with an implementation of the present invention.

For example, FIG. 1D illustrates that a user can select an overhead cabinet icon 130 from the toolbar 102. The user can then indicate the lateral and longitudinal position of an overhead cabinet 130a within the design space 110. In the implementation illustrated in FIG. 1D, the user selects and places the overhead cabinet 130a at the same lateral and longitudinal position as the work surface 122d of the product assembly 112c. Based upon one or more attributes and product parameters associated with one or more of the overhead cabinet 130a, work surface 122d, the panel divider 120d, and the product assembly 112c stored within the object database 115, the design software system can constrain the vertical positioning of the overhead cabinet 130a to an appropriate, real-world location.

In particular, the attributes and product parameters associated with the overhead cabinet 130a, work surface 122d, the panel divider 120d, and the product assembly 112c can dictate which vertical positions are allowed or feasible when an overhead cabinet 130a is combined with a product assembly 112c. For instance, according to some implementations of the present invention, the design software system can constrain the overhead cabinet 130a reference copies to a single vertical position with the top of the overhead cabinet 130a being flush with the top of the panel divider 120d. In such cases, the design software system can automatically place the overhead cabinet 130a in the allowed vertical position.

According to other implementations of the present invention, the attributes and product parameters associated with the overhead cabinet 130a, work surface 122d, and the product assembly 112c may dictate two or more possible vertical locations for the overhead cabinet 130a (e.g., midway up the panel divider 120d or flush with the top of the panel divider 120d). In such situations where there is no one single valid solution without further user input, the design software system can place the component in a default position (or one of several applicable positions), or provide an auto-solve function. For example, the design software system can generate a warning notification, offering all possible solutions.

Furthermore, where a specific solution has been selected multiple times, the specific solution has been set as a preferred solution, or a specific solution is preferred due to cost, installation ease, etc., the design software system can provide it as a default solution. For instance, if a user has selected the option to place various overhead cabinets 130a flush with their respective panel dividers 120, the next time the user places an additional overhead cabinet 130a, the design software system can automatically place the additional overhead cabinet 130a flush with its respective panel divider 120. The design software system can then prompt the user to accept this change, or view additional possible alternative solutions. One will appreciate that the design software system can provide an auto-solve function not only when constraining the vertical placement of design components within the design space 110, but also with any design decision or change that requires user input or the selection between multiple possible solutions.

Additionally, one will appreciate in light of the disclosure herein that upon the introduction of a new design component within the design space 110, such as overhead cabinet 130a, each component in the design space can automatically resolve itself. For example, upon completion of a line or placement of a component, the design software system can automatically apply default attributes, parameters, and options to all of the component(s). If the user introduces additional components to the existing design, each of the intelligent software objects (including objects for both original components and newly introduced components) automatically resolve themselves (or themselves in conjunction with resolution of other related software objects) in the design, providing a continuously resolved solution at all times. In particular, if the user places the overhead cabinet 130a on a panel divider 120d a cantilever support on the work surface below may not provide enough stability for the complete assembly. In such instances the design software system can automatically introduce a C-shaped support from work surface 120d to floor or similar type support beneath the work surface 120d to support the extra weight of the overhead cabinet 130a and its potential contents. Furthermore, all of the other design components within the design space 110 can similarly automatically resolve themselves. For instance, the design software program can automatically reposition or resize the panel dividers 120, connectors, etc. adjacent panel divider 120d to accommodate the C-shaped support In addition, the design software system can further comprise one or more pre-solve functions, which can provide a user feedback pro-actively, such as when the design is being created. One will appreciate that the pre-solve function can communicate options available, which are related to the user's design modifications. For example, when the user adds an overhead cabinet or makes another change that requires the modification of the size of a panel divider or other component, the design software system can recognize as much and communicate this back to the user. In such cases, the design software system can recognize that either the adjacent components need to change in size, or stay the same size and move in unison with the changing component.

According to some implementations of the present invention, if the user wishes the adjacent items to resize, the user may not need to take further action. For example, the design software system can recognize resizing of adjacent components as a default. In such cases, the design software system can produce a warning containing an indication of both solutions (i.e., resizing and repositioning), and bold the default solution. According to some implementations of the present invention, the user can enter input to select the default solution (e.g., press the enter key or the R key to resize adjacent and subsequent components). If the user prefers the adjacent and subsequent components to move, the user can select the non-default solution by holding down a particular key (e.g., the M key to move adjacent components), to enact the movement function or provide some other type of user input.

While the interface 100 shown in FIGS. 1A-1D is generally a two-dimensional ("2D") plan view interface, the design software system can also represent components in a three-dimensional ("3D") interface, in which the user or the design software system can place design components and make other changes to the design space directly. For example, the present invention can include additional and alternative systems and methods for displaying automatically resolved user input in two or more dimensional views in a realistic manner.

Specifically, the design software can automatically implement changes made in a two-dimensional interface to the views in a three-dimensional interface. This is possible at least in part since all interfaces of the software can utilize the same database, and further since the system has already previously rendered image information associated with each component that the user selects within the interface 100. As such, the design software system can represent a single dataset as two-dimensional and three-dimensional graphical representations instantly and interchangeably.

Figure 1E:
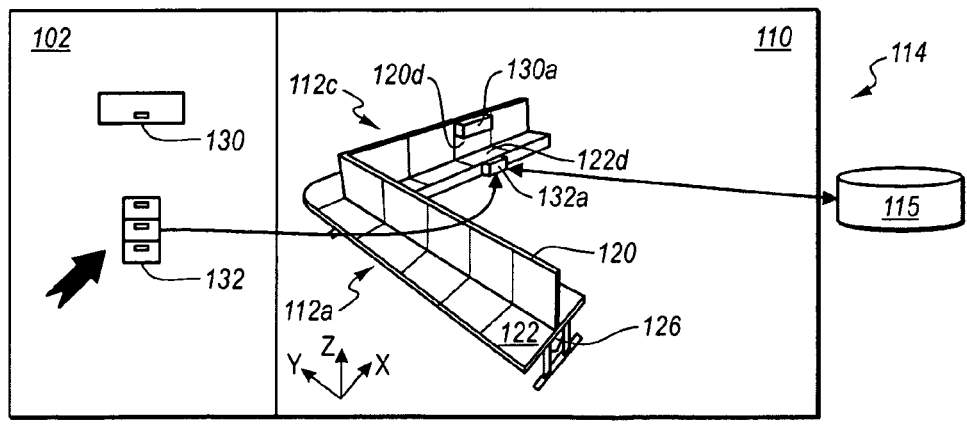
FIG. 1E illustrates a conceptual diagram of a three-dimensional user interface including a three-dimensional representation of the design space and components of the user interface of FIG. 1D.

For example, FIG. 1E illustrates a 3D graphical interface 114 corresponding to the 2D graphical interface 100 illustrated by FIG. 1D. Upon the opening of the 3D interface (and dynamically in unison with additional user input) the system can automatically represent the design components in 3D depiction. For example, FIG. 1E illustrates that the 3D interface 114 illustrates the product assemblies 112a, 112c created in the 2D interface 100 in a 3D rendering.

One will appreciate in light of the disclosure herein that a user can make changes directly in the 3D interface 114 (this is in contrast to conventional 3D rendering programs that only allow for modification in a plan view). For example, FIG. 1E illustrates that a user selects the icon 132 representing a file cabinet and indicates a desired position of a file cabinet 132a below the work surface 122d. Upon receiving such user input, the design software system can automatically generate the file cabinet 132a in the 3D interface 114 as shown in FIG. 1E. One will appreciate in light of the disclosure herein that the 2D and 3D interfaces can update accordingly with each user input, as each design component automatically resolves itself. For instance, the design software system can automatically create and resolve file cabinet 132a created in the 3D interface 114 in the 2D interface 100. As a result, auditing between the various outputs may not ordinarily be required. Rather, validation of the design in one view confirms accuracy of the design in the other views as well.

Additionally, at any time before, during, or after design layout of any componentry, a user can open a separate textual interface (a Bill of Materials, Order Proposal, parts list, reports, etc.). The software system can further automatically maintain an ongoing, accurate parts list that lists each design component, each connector and bracket included in a design layout. Thus, the user can have confidence that, should they submit an order for the three-dimensional design the user has just made, that all diagrams, dimensions, and components submitted to any entity with the order will be appropriate.

For example, implementations of the present invention can include additional and alternative systems and methods for the continual generation of an accurate parts list along with the user input, which the software system can display in a parts list interface, and which does not need further review for correction or additional parts before ordering. In addition to the components, modules, and mechanisms described herein above, implementations of the present invention can include additional or alternative components, modules, and mechanisms to help increase the accuracy, speed of creation, and validity of furniture design layouts. For example, each design component can include grips that allow a user to manipulate, change, or modify the dimensions and/or shape of a design component. The use of the grips is described herein below with reference to FIGS. 2A and 2B.

Figure 2A:
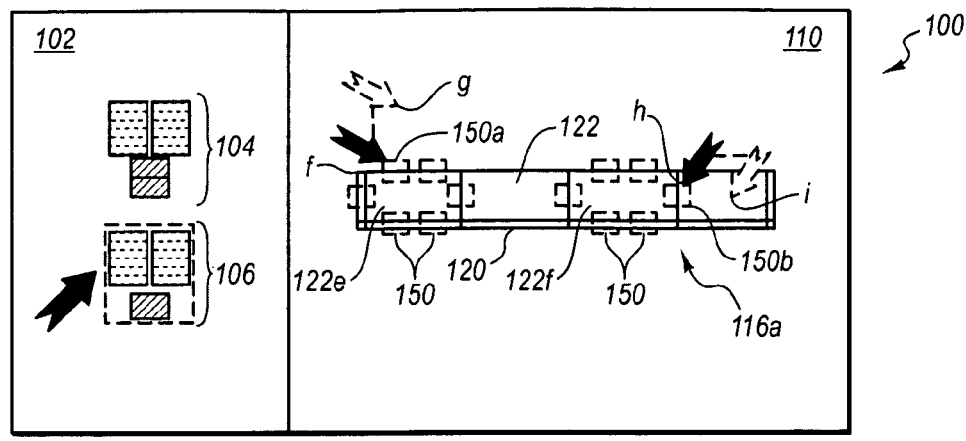
FIG. 2A illustrates a conceptual diagram of a user interface and one or more components of a design software program when a user enters input into a design space to modify one or more of the components in accordance with an implementation of the present invention.

For example, FIG. 2A illustrates a product assembly 116a comprising panel dividers 120 and work surfaces 122 secured to one side thereof. One will appreciate the user can create the product assembly 116a by selecting the icon 106, and drawing a line in a manner similar to that previously described in reference to the product assembly 112a shown and described in relation to FIG. 1A. As shown in FIG. 2A, the design software system can automatically populate the panel dividers 120 and the work surfaces 122 with default dimensions and shapes.

FIG. 2A also illustrates that the design software system can display grips 150 associated with work surfaces 122e and 122f. One will appreciate in light of the disclosure herein that the design software system can display grips 150 for each component within the design space 110, or one which a user highlights or selects. As shown in FIG. 2A, grips 150 can comprise boxes or other icons or symbols placed around the outer edges of a component. A user can highlight or select a grip 150 and move it to modify the shape or dimension of at least a portion of the component, as described in greater detail below. The design software system can display grips 150 in the 2D interface 110 as shown in FIG. 2A. Additionally, one will appreciate that the design software system can also display grips 150 in the 3D interface 114.

FIG. 2A does not illustrate any brackets connecting the work surfaces 122 to aid in depiction of the grips 150. As shown in FIG. 2A, to modify the dimension and/or shape of a design component, a user can manipulate or move one or more grips 150 associated with each design component. For example, FIG. 2A illustrates that a user moves grip 150a associated with work surface 122e from a default position "f" to a new position "g."

Figure 2B:
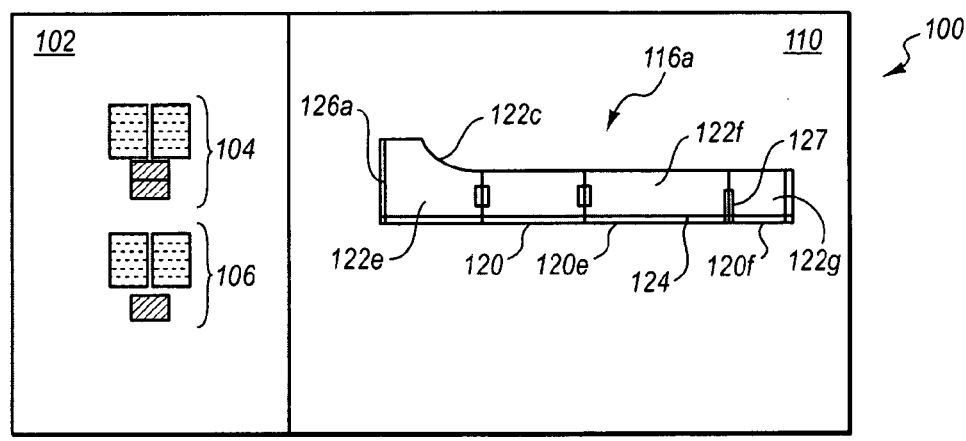
FIG. 2B illustrates a conceptual diagram of the user interface of FIG. 2A in which the design software program automatically resolves each component in the design space based on user input in accordance with an implementation of the present invention.

Upon receiving the user input moving the grip 150a, the design software system can automatically resolve the work surface 122e to reflect the user's design intent. For example, FIG. 2B illustrates that the design software system can automatically modify the dimensions and shape of the work surface 122e to comprise a wave work surface reflecting the repositioning of the grip 150a. Furthermore, the design software system can automatically resolve and make any necessary connector and bracketry changes to support the change of the work surface 122e. For example, FIG. 2B illustrates that the design software system automatically replaces the end support connected to the work surface 122e with an end support 126a having increased length.

FIGS. 2A and 2B also illustrate that the user can change the dimension of one or more components at any time. Specifically, the user can keep the components on-module with related components, or off-module (non-aligning seams) as shown. In other words, the user can request that the design software system ensures that all components remain aligned along seams with adjacent components (on-module), or allow a user to modify the dimensions of a design component so it is not aligned with seams of an adjacent component (off-module). For example, FIG. 2A illustrates that each of the work surfaces 122 are on-module or aligned with the seams of each of the panel dividers 120.

When in an off-module mode, the design software program allows the user to change the dimensions of a work surface 122f so it is not aligned with the seams of adjacent panel dividers 120. For example FIG. 2A illustrates that a user moves a grip 150b associated with work surface 122f from a default position "h" to a new position "i." FIG. 2B illustrates that upon receiving this user input, the design software system automatically modifies the dimension of the work surface 122f by increasing its length. Furthermore, FIG. 2B shows that the right edge of the work surface 122f is no longer aligned with the seam 124 between the panel dividers 120e and 120f.

According to some implementations of the present invention, adjacent components affected by the user-driven change can be updated automatically, changing dimensionally to accommodate the user's modification while maintaining the overall drawn line dimension. (By contrast, some conventional programs can require the discarding and replacement of both work-surface components, rather than the simple modification of one.) For example, FIG. 2B shows that the design software system can automatically shorten the length of the work surface 122g to accommodate the increased length of the work surface 122f.

Additionally, in the event off-module applications may require different support bracketry between the work-surface and the panel divider, implementations of the present invention can resolve the relationships and place correct bracketry where required, such as previously described herein. (By contrast, some conventional software programs can require the human user to replace or change out any hardware or connectors manually.) For example, FIG. 2B illustrates that the design software program automatically inserts a cantilever support 127 to support the modified work surfaces 122f and 122g.

Figure 2C:
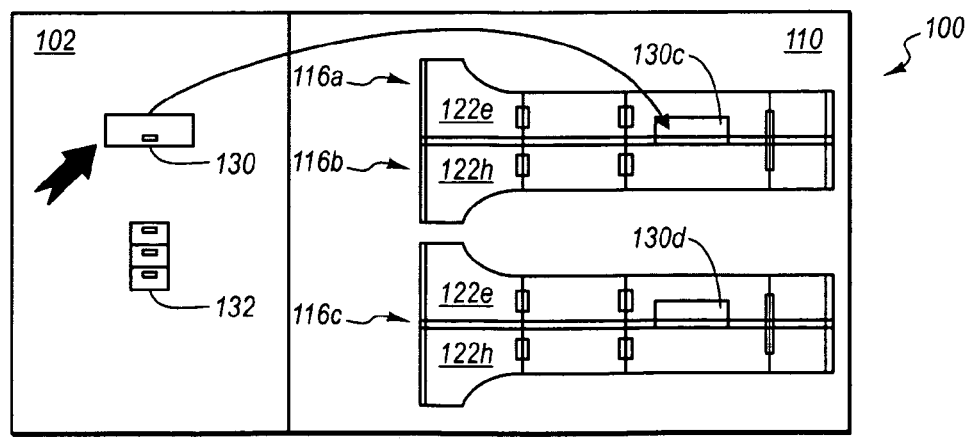
FIG. 2C illustrates a conceptual diagram of the user interface of FIG. 2B when a user enters input into a design space to make changes to one or more components in an original assembly and the design software automatically populates similar changes to one or more components in a reference assembly in accordance with an implementation of the present invention.

One or more implementations of the present invention also allow for a user to copy and/or mirror design components and/or product assemblies. For example, FIG. 2C illustrates that upon receiving user input, the design software system can automatically create a mirrored copy 116b of the product assembly 116a. As shown in FIG. 2C, the mirrored copy 116b can include mirrored individual components, such as, a mirrored copy 122h of the wave work surface 122e. In addition, the design software system can automate design change resolution to the extent that the design software system can recognize duplicate components, and merge them within the design and related documentation such as a Bill of Materials. For example, FIG. 2C illustrates that when the product assembly 116b is abutted against the product assembly 116a, the design software program recognizes the intent of the single set of panel dividers with work-surfaces on either side. In response, the design software system automatically removes one set of panel dividers, and thus merges the designs. In other words, as illustrated in FIG. 2C, the design software system automatically removes the redundant panel dividers 120.

Additionally, implementations of the present invention can allow for the re-creation of reference copies from an original layout, in order to speed change of large furniture layouts. For example, the user can copy an original grouping and past multiple reference copies. When the user makes changes to the original, the design software system can update all reference copies in unison. The user can break the link between the original and reference at any time, allowing for customization of specific groupings where required. For example, in FIG. 2C the user copies product assemblies 116a and 116b to create product assembly 116c. The user designates the product assembly 116c as a reference copy of the combination of product assemblies 116a, 116b. FIG. 2C further illustrates when a user selects and adds an overhead cabinet 130c to the combination of product assemblies 116a, 116b, the design software system automatically adds a corresponding overhead cabinet 130d to the reference product assembly 116c.

Implementations of the present invention can also allow the conversion of a design from one product line to another, and to resolve all components, behaviors, and relationships to the design, in relation to the newly selected product line. For example, although Product A and Product B may be similar in nature, they may have differing dimensional constraints, interconnection types, available finishes, etc. Similarly, Product A may even be parametric and Product B may be incremental. Even though a design layout is created in Product A, if the user wishes to change to Product B (either for a known requirement for the change for simply to explore cost or other ramifications of the product line change) the user can make the change without additional rework. Upon receiving user input requesting the change of a design from one product line to another, the design software system can automatically resolve the design and update all databases and representations (e.g., 2D, 3D, textual). In particular, the design software program can consider the underlying design lines as a schematic layout, no matter which product is represented by the lines themselves, and thus provide system change without rework of the design.

Figures 3, 4:
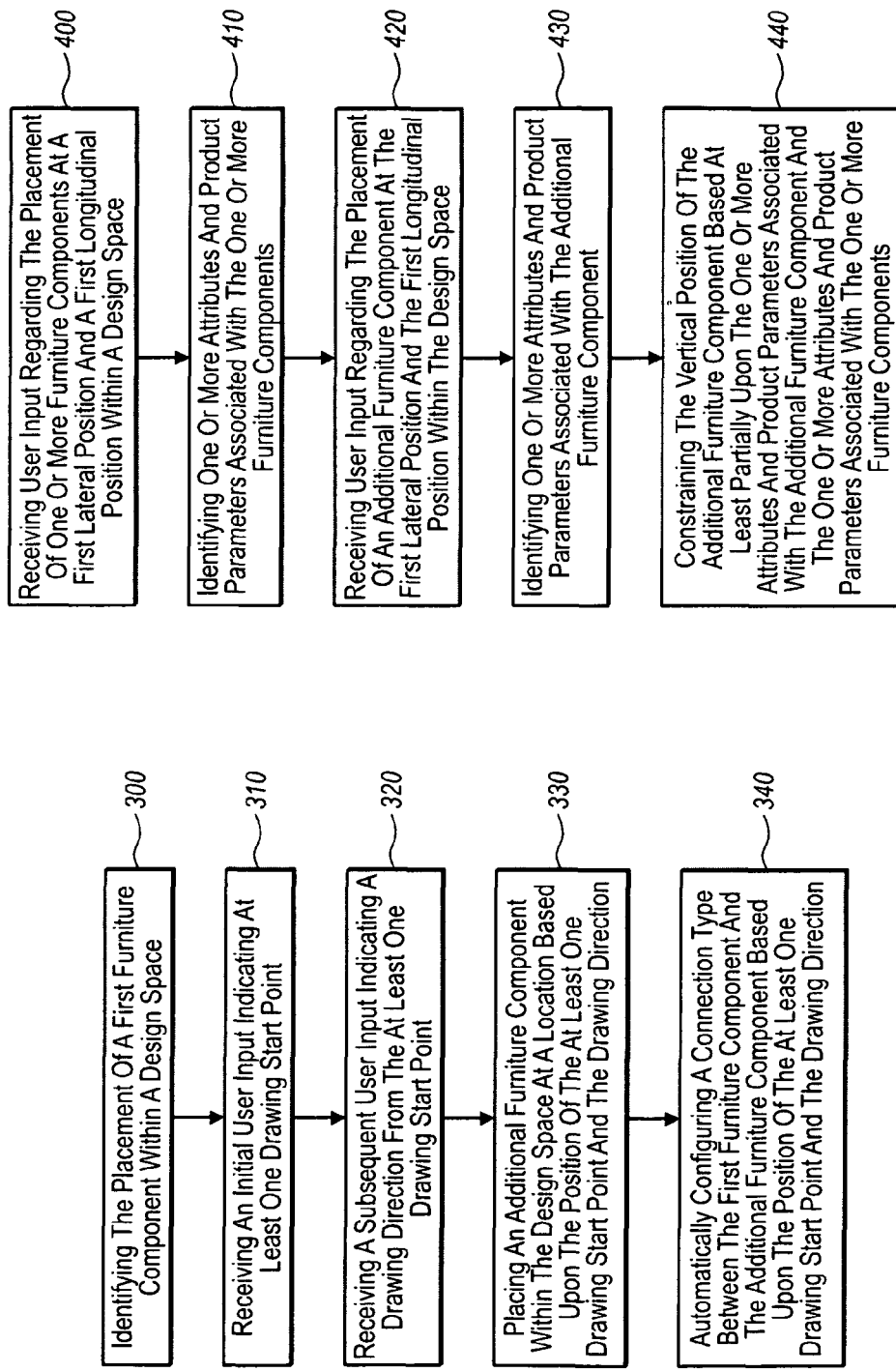
FIG. 3 illustrates a flowchart of a series of acts in a method in accordance with an implementation of the present invention of interpreting user input to select and configure an interconnection type between components in a design space.
FIG. 4 illustrates a flowchart of a series of acts in a method in accordance with another implementation of the present invention of automatically constraining the vertical positioning of components within a design space.
Figure 5:
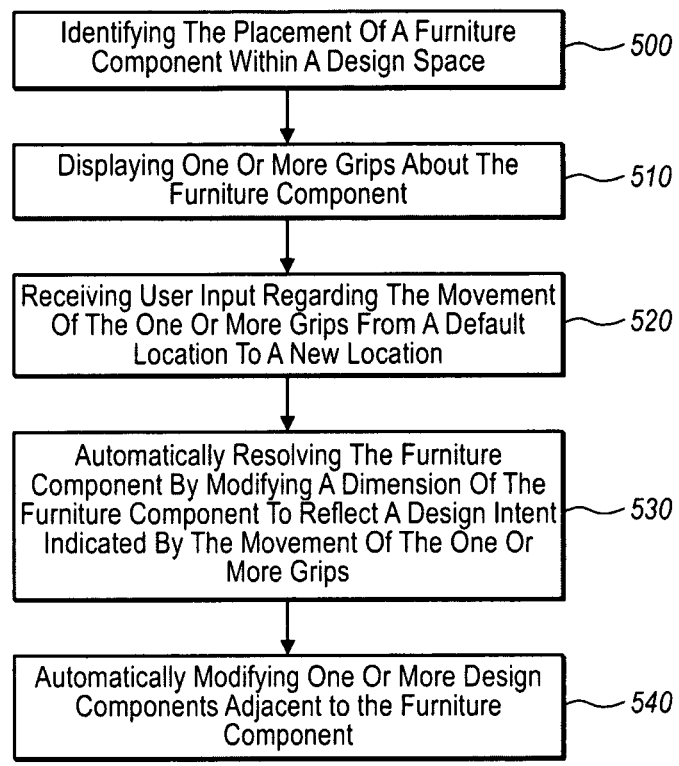
FIG. 5 illustrates a flowchart of a series of acts in a method in accordance with yet another implementation of the present invention of modifying the dimensions of a design component within a design space.

Accordingly, FIGS. 1A-2C and the corresponding text illustrate or describe a number of components, modules, and mechanisms that can enhance the efficiency, accuracy, and speed with which a user can create a design layout. Along similar lines the components, modules, and mechanisms described above in relation to FIGS. 1A-2C can also reduce the knowledge needed by a user to create an accurate and complete design layout. In addition to the foregoing, implementations of the present invention can also be described in terms of one or more acts in a method for accomplishing a particular result. For example, FIGS. 3, 4 and 5 illustrate flowcharts of computer-implemented methods of creating design layouts based on user input. The acts of these flowcharts are described below with respect to the components and diagrams of FIGS. 1A-2C.

For example, FIG. 3 shows that a method in accordance with an implementation of the present invention can comprise an act 300 of identifying the placement of a first furniture component within a design space. Act 300 can involve identifying the placement of a first furniture component added to the design space by the user from a menu or toolbar, or identifying a first furniture component imported into the design space from another software program. For example, FIG. 1A illustrates that the design software program identifies the placement of a first furniture component (i.e., product assembly 112a) as a user selects icon 104 and draws the product assembly 112a within the design space 110 of the interface 100. One will appreciate that the first furniture component need not be a product assembly 112a, but can be an individual component, such as, for example, a wall divider, a work surface, a bracket or other connector, a chair, a table, etc.

FIG. 3 also shows that a method in accordance with an implementation of the present invention can comprise an act 310 of receiving an initial user input indicating at least one drawing start point. Act 310 can involve receiving input from a user that corresponds to placing, repositioning, or changing of a drawing starting point within the design space. For example, FIG. 1B shows the interface 100 of the design software program receives user input indicating the position of a drawing start point at position "c" along the edge of the product assembly 112a. Similarly, FIG. 1C shows that the interface 100 of the design software program receives user input indicating the position of a drawing start point at position "e" within the center of the product assembly 112a. One will appreciate that the method can also involve receiving user input regarding the selection of a furniture component prior to, or in tandem with, act 310. For example, both FIGS. 1B and 1C show that the interface 100 of the design software program receives user input regarding the section of icon 104 associated with a panel divider and two work surfaces.

In addition, FIG. 3 shows that a method in accordance with an implementation of the present invention can comprise an act 320 of receiving a subsequent user input indicating a drawing direction from the at least one drawing start point. Act 320 can involve receiving user input indicating the direction along which the user desires to place an additional furniture component within the design space. For example, FIGS. 1B and 1C illustrates that the interface 100 of the design software program receives user input regarding a drawing direction from the at least one drawing start point (points "c" and "e" respectively) generally in a direction perpendicular to the product assembly 112a.

Additionally, act 320 can involve receiving user input indicating a desired length or run of the additional furniture component. For example, FIG. 1B illustrates that the interface of the design software program receives user input regarding a desired length or run from point "c" to point "d." One will appreciate that the design software system can constrain the distance from point "c" to point "d" based upon the attributes and parameters associated with the selected furniture component as described in greater detail hereinabove.

Furthermore, FIG. 3 shows that the method can comprise an act 330 of placing an additional furniture component within the design space at a location based upon the position of the at least one drawing start point and the drawing direction. Act 330 can involve automatically populating the additional furniture component within the design space. For example, FIG. 1B illustrates that the design software program places an additional furniture component (e.g., product assembly 112*b*) within the design space 110 of the interface 100. Furthermore, FIG. 1B illustrates that the design software program places the product assembly 112*b* at a location corresponding to the user input received regarding the drawing start point (i.e., point "c") and the drawing direction (the direction generally from point "c" to point "d").

Act 330 can also involve automatically placing all of the bracketry and connectors needed to interconnect the additional furniture component. For example, FIG. 1B illustrates that the design software program automatically places all of the brackets 124 and end supports 126 necessary to connect and support the work surfaces 122 and panel dividers 120 of the product assembly 112*b*. One will appreciate that in the implementations of the present invention where the additional furniture component comprises a single furniture component (a wall, a wall divider, a work surface, a desk etc.), connectors and bracketry may not be necessary.

FIG. 3 also shows that the method can comprise an act 340 of automatically configuring an interconnection type between the first furniture component and the additional furniture component based upon the position of the at least one drawing start point and the drawing direction. Act 340 can involve ascertaining the user's design intent regarding the type of interconnection desired between the first furniture component and the additional furniture component by interpreting the position of the at least one drawing start point and the drawing direction.

For example, FIG. 1B illustrates that the design software program automatically creates an L-corner joint between the first furniture component (i.e., product assembly 112*a*) and the additional furniture component (i.e., product assembly 112*b*) by abutting the product assembly 112*b* against the product assembly 112*a*. The design software program can configure the L-corner joint based on the location of the drawing start point "c" being adjacent the edge of the product assembly 112*a*, and the drawing direction from the drawing start point toward the point "d." FIG. 1B also illustrates that the design software program automatically populates the necessary connection components (i.e., brackets 124) to secure the product assembly 112*b* to the product assembly 112*a*.

In contrast to FIG. 1B, FIG. 1C illustrates that the design software program automatically creates an angled corner joint between the first furniture component (i.e., product assembly 112*a*) and the additional furniture component (i.e., product assembly 112*c*). The design software program can configure the angled corner joint based on user input indicating the location of the drawing start point "e" at or near the center of the product assembly 112*a*, and the drawing direction from the drawing start point toward the point "d." FIG. 1C also illustrates that the design software program automatically populates the necessary connection components (i.e., brackets 124) to secure the product assembly 112*c* to the product assembly 112*a*.

Act 340 can also involve automatically adding, removing, or modifying one or more parts or components of the one or both of the first furniture component and the additional furniture component to accommodate the interconnection type. For example, FIG. 1B illustrates that the design software program modifies the length of the panel divider 120*a* and the work surface 122 of the product assembly 112*a* against which the product assembly 112*b* is abutted. Similarly, FIG. 1C illustrates that the design software program adds a rounded corner work surface 129 and an angled corner work surface 128 to facilitate the angled interconnection between the product assembly 112*a* and the product assembly 112*c*.

In addition to the forgoing, FIG. 4 illustrates that an additional or alternative method in accordance with an implementation of the present invention can comprise an act 400 of receiving user input regarding the placement of one or more furniture components at a first lateral position and a first longitudinal position within a design space. Act 400 can involve identifying the placement of one or more first furniture components added to the design space by the user from a menu or toolbar or identifying a first furniture component imported into the design space from another software program. For example, FIG. 1C illustrates that the design software program identifies the placement of one or more furniture components (i.e., product assembly 112*c*) at a first lateral position and a first longitudinal position within the design space 110 as a user selects icon 104 and draws the product assembly 112*c* within the design space 110 of the interface 100.

FIG. 4 also shows that a method in accordance with an implementation of the present invention can comprise an act 410 of identifying one or more attributes and product parameters associated with the one or more furniture components. Act 410 can involve identifying product features and characteristics associated with the one or more furniture components, such as, for example, size, shape, color, type, texture, price, material composition, etc. Act 410 can also involve identifying rules and behaviors associated with the one or more furniture components, such as, for example, the type and number of connectors and bracketry needed to support each component or assembly, how the components and assemblies interact with other design elements, applicable codes, manufacturing guidelines, and physical limitations. For example, FIG. 1C illustrates that the design software program can create intelligent, automatically resolvable objects for each component that includes one or more attributes and product parameters, which the design software program can store in an object database 115.

In addition, FIG. 4 shows that a method in accordance with an implementation of the present invention can comprise an act 420 of receiving user input regarding the placement of an additional furniture component at the first lateral position and the first longitudinal position within the design space. Act 420 can involve identifying the placement of an additional furniture component added to the design space by the user from a menu or toolbar or identifying an additional furniture component imported into the design space from another software program. For example, FIG. 1D illustrates that the design software program identifies the placement of an overhead cabinet 130*a* at the first lateral position and the first longitudinal position within the design space 110 (i.e., the same lateral and longitudinal position as the work surface 122*d* of the product assembly 112*c*). Additionally, FIG. 1E illustrates that the design software program identifies the placement of a file cabinet 132*a* at the first lateral position and the first longitudinal position within the design space 110 (i.e., the same lateral and longitudinal position as the work surface 122*d* and the overhead cabinet 130*a*).

Furthermore, FIG. 4 shows that the method in accordance with an implementation of the present invention can comprise an act 430 of identifying one or more attributes and product parameters associated with the additional furniture component. Act 430 can involve identifying product features and characteristics associated with the additional furniture component, such as, for example, size, shape, color, type, texture, price, material composition, etc. Act 430 can also involve identifying rules and behaviors associated with the additional furniture component, such as, for example, the type and number of connectors and bracketry needed to support the component or assembly, how the components and assemblies interact with other design elements, applicable codes, manufacturing guidelines, and physical limitations. For example, FIGS. 1D and 1E illustrate that the design software program can create intelligent, automatically resolvable objects for the overhead cabinet 130*a* and the file cabinet 132*a* that include one or more attributes and product parameters.

Still further, FIG. 4 shows a method in accordance with an implementation of the present invention can comprise an act 440 of constraining the vertical position of the additional furniture component based at least partially upon the one or more attributes and product parameters associated with the additional furniture component and the one or more attributes and product parameters associated with the one or more furniture components. Act 440 can involve automatically resolving the vertical position of the additional furniture relative to the other components within the design space based on the attributes and product parameters associated with each component within the design space. For example, FIG. 1E illustrates that the design software program constrains the vertical position of the file cabinet 132*a* on the ground vertically below the work surface 122*d*. Similarly, FIG. 1D illustrates that the design software program constrains the vertical position of the overhead cabinet 130*a* on the wall divider 120*d*, vertically above the work surface 122*d*.

Additionally, FIG. 5 illustrates that an additional or alternative method in accordance with an implementation of the present invention can comprise an act 500 of identifying the placement of a furniture component within a design space. Act 500 can involve identifying the placement of a furniture component added to the design space by the user from a menu or toolbar, or identifying a first furniture component imported into the design space from another software program. For example, FIG. 2A illustrates that the design software program identifies the placement of a furniture component (i.e., product assembly 116*a*) as a user selects icon 106 and draws the product assembly 116*a* within the design space 110 of the interface 100. One will appreciate that the first furniture component need not be a product assembly 116*a*, but can be an individual component, such as, for example, a wall divider, a work surface, a bracket or other connector, a chair, a table, etc.

FIG. 5 also shows that a method in accordance with an implementation of the present invention can comprise an act 510 of displaying one or more grips about the furniture component. The act 510 can involve displaying the one or more grips about each component of a product assembly, about an entire product assembly, or both. For instance, FIG. 2A illustrates that the design software system displays grips 150 about the work surfaces 122*e* and 122*f*.

Still further, FIG. 5 shows that a method in accordance with an implementation of the present invention can comprise an act 520 of receiving user input regarding the movement of the one or more grips from a default location to a new location. Act 520 can involve moving a single grip or multiple grips in unison. For example, FIG. 2A illustrates that a user moves grip 150*a* from a default location "f" to a new location "g." Additionally, FIG. 2A illustrates that a user moves grip 150*b* from a default location "h" to a new location "i."

Furthermore, FIG. 5 shows that a method in accordance with an implementation of the present invention can comprise an act 530 of automatically resolving the furniture component by modifying a dimension of the furniture component to reflect a design intent indicated by the movement of the one or more grips. Act 530 can involve changing the shape of the furniture component or maintaining a shape and increasing the size of the furniture component. For example, FIG. 2B illustrates that the design software system can modify the work surface 122*e* to include a wave pattern. Furthermore, FIG. 2B illustrates that the design software system can modify the length of the work surface 122*f*.

Additionally, FIG. 5 shows that the method in accordance with an implementation of the present invention can comprise an act 540 of automatically modifying one or more design components adjacent to the furniture component. Act 540 can involve adding or removing an adjacent design component, or modifying the dimensions of the one or more adjacent design components. For example, FIG. 2B illustrates that the design software system automatically increases the length of the end support 126*a*. Additionally, FIG. 2B illustrates that the design software system automatically adds a new cantilever support 127.

In view of the foregoing, one will appreciate that the components and modules of the present invention can increase the accuracy, speed of creation, and validity of furniture design layouts, while also reducing dependency upon the skill of the user. For example, components and modules of the present invention can capture product knowledge automatically rather than requiring the user to know and remember how various products and components interact and inter-relate. This automatic calculation and correction by the software can minimize human error, allow for immediate design change without rework, reduce or eliminate manual audit processes, and automate drawing and document creation processes. Such error reduction is further enhanced not only by automated corrections, but also due to accurate 3D validation of the design, and further allowing more sales due to the faster time to delivery and powerful visual lure of the 3D representation.

The embodiments of the present invention may comprise a special purpose or general-purpose computer including various computer hardware, as discussed in greater detail below. Embodiments within the scope of the present invention also include computer-readable media for carrying or having computer-executable instructions or data structures stored thereon. Such computer-readable media can be any available media that can be accessed by a general purpose or special purpose computer.

By way of example, and not limitation, such computer-readable media can comprise RAM, ROM, EEPROM, CD-ROM, DRAM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The present invention may be embodied in other specific forms without departing from its spirit or essential characteristics. For example, one will appreciate in light of the disclosure herein that, if desired, a user can manually perform each step described herein as being automatically performed by the design software system (e.g., placement, modification, addition, and removal of design components and interconnection types). Additionally, the user can manually change any action taken by the software system. Thus, the described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

I claim:

1. In a computer system, a computer-implemented method for automatically configuring a design space by using product parameters and attributes to replicate a given product based on a user's gesture for indicating placement, and then automatically populating the design space with all required connectors and bracketing to support the indicated placement of the given product, the computer-implemented method of the system comprising:

storing in a database a plurality of different product components to be used in designing an interior workspace, each product component being defined by (i) associated parameters that define each type of component, and (ii) attributes that are defined by rules, characteristics and behaviors of each component and any associated hardware for connecting or providing structural support for each type of component;

inputting at a graphical user interface (GUI) of the system a design space and identifying within the design space a first product component that is to be placed within an indicated region of the design space defined by a starting and an end point;

a system processor thereafter retrieving from the database the identified first product component and automatically replicating the first product component in a manner that fits the first product component to the indicated region of the design space, including automatically populating the indicated region of the design space with any associated hardware for connecting or providing structural support to the replicated product components required to fit the first product component within the indicated region of the design space;

identifying a second product component from a different product line that is to be used instead of the first product component in the design space within the indicated region defined by the starting and end points; and the system processor thereafter retrieving from the database the identified second product component and automatically replicating the second product component in a manner that fits the second product component to the indicated region of the design space previously occupied by the first product component, including automatically populating the indicated region of the design space with any associated hardware for connecting or providing structural support required to fit the second product component within the indicated region of the design space.

2. The method as recited in claim 1, further comprising inputting at the GUI of the system a third product component that is to be integrated as part of the design space for the interior workspace and the system processor thereafter retrieving from the database the identified third product component and automatically integrating the third product component into the design space in a manner that fits the second and third product components to the indicated region of the design space, including automatically populating the indicated region of the design space with any associated hardware for connecting or providing structural support to the second and third product components, including any replications thereof, required to fit the second and third product components within the indicated region of the design space.

3. The method as recited in claim 2, wherein the system also generates a fully compatible three-dimension view of the design space and wherein any changes to one view provide a continuously resolved solution to every other view.

4. The method as recited in claim 3, further comprising copying at least one or the other of the second and third product components and pasting the copied product component within the design space, and then automatically updating the associated hardware for connecting or providing structural support for the copied product component based on the associated parameters that define the copied type of component and the attributes that are defined by rules, characteristics and behaviors of the copied component.

5. The method as recited in claim 4, wherein the three-dimensional view is updated consistent with the copied product component added to the design space.

6. The method as recited in claim 1, wherein the GUI is divided into a first area for the design space, and a second area containing a plurality of product components that can be dropped and dragged into the first area.

7. In a computer system, a computer-implemented method for automatically configuring a design space in a first two-dimensional view by using product parameters and attributes to replicate a given product based on a user's gesture for indicating placement, and then automatically populating the two-dimensional and a related three-dimensional design space with all required connectors and bracketing to support the indicated placement of the given product, the computer-implemented method of the system comprising:

(a) storing in a database a plurality of different product components to be used in designing an interior workspace, each product component being defined by (i) associated parameters that define each type of component, and (ii) attributes that are defined by rules, characteristics and behaviors of each component and any associated hardware for connecting or providing structural support for each type of component;

(b) inputting at a graphical user interface (GUI) of the system a two-dimensional design space and identifying within the two-dimensional design space a first product component that is to be placed within an indicated region of the design space defined by a starting and an end point;

(c) a system processor thereafter retrieving from the database the identified first product component and automatically replicating the first product component in a manner that fits the first product component to the indicated region of the two-dimensional design space, including automatically populating the indicated region of the two-dimensional design space with any associated hardware for connecting or providing structural support to the replicated product components required to fit the first product component within the indicated region of the design space;

(d) the system processor automatically constraining the vertical position of the first product component and generating a three-dimensional view that is fully consistent with the two-dimensional view, including automatically populating the corresponding indicated region in the three-dimensional design space with any associated hardware for connecting or providing structural support to the replicated product components required to fit the first product component within the indicated region of the design space; and (e) replacing the first product component with a second product component from a different product line and then repeating (b) through (d) for the second product component.

8. The method as recited in claim 7, further comprising repeating (b) through (d) for one or more other product components different than said second product components and then generating a list of possible vertical positions at which the one or more other product components may validly be positioned.

9. The method as recited in claim 8, further comprising receiving user input at the GUI for the selection of a desired vertical position.

10. The method as recited in claim 7, further comprising copying at least one or the other of the first and second product components and pasting the copied product component within the design space, and then automatically updating the associated hardware for connecting or providing structural support for the copied product component based on the associated parameters that define the copied type of component and the attributes that are defined by rules, characteristics and behaviors of the copied component.

11. The method as recited in claim 10, wherein both the two-dimensional and the three-dimensional views for the design space are consistently resolved to reflect the copied type of component and associated hardware for providing connection to other product components and/or structural support.

12. The method of claim 1 further comprising a non-volatile memory medium for storing computer-executable instructions which, when down loaded to the computer system, cause the computer-implemented method to be executed by the computer system.

13. The method of claim 7 further comprising a non-volatile memory medium for storing computer-executable instructions which, when down loaded to the computer system, cause the computer-implemented method to be executed by the computer system.

14. A computer system for automatically configuring a design space by using product parameters and attributes to replicate a given product based on a user's gesture for indicating placement, and then automatically populating the design space with all required connectors and bracketing to support the indicated placement of the given product, the computer system comprising:

a database for storing a plurality of different product components to be used in designing an interior workspace, each product component being defined by (i) associated parameters that define each type of component, and (ii) attributes that are defined by rules, characteristics and behaviors of each component and any associated hardware for connecting or providing structural support for each type of component;

a graphical user interface (GUI) of the system for inputting a design space and identifying within the design space a first and a second product component that is to be placed within an indicated region of the design space defined by a starting and an end point;

a system processor programmed to (i) retrieve from the database the identified first product component and automatically replicate the first product component in a manner that fits the first product component to the indicated region of the design space, including automatically populating the indicated region of the design space with any associated hardware for connecting or providing structural support to the replicated product components required to fit the first product component within the indicated region of the design space; and (ii) thereafter retrieving from a second product component from a different product line and automatically replicating the second product component in a manner that fits the second product component to the indicated region of the design space previously occupied by the first product component, including automatically populating the indicated region of the design space with any associated hardware for connecting or providing structural support required to fit the second product component within the indicated region of the design space.

15. A computer system for automatically configuring a design space in a first two-dimensional view by using product parameters and attributes to replicate a given product based on a user's gesture for indicating placement, and then automatically populating the two-dimensional and a related three-dimensional design space with all required connectors and bracketing to support the indicated placement of the given product, the computer system comprising:

a database for storing a plurality of different product components to be used in designing an interior workspace, each product component being defined by (i) associated parameters that define each type of component, and (ii) attributes that are defined by rules, characteristics and behaviors of each component and any associated hardware for connecting or providing structural support for each type of component;

a graphical user interface (GUI) for inputting to the system a two-dimensional design space and identifying within the two-dimensional design space a first product component that is to be placed within an indicated region of the design space defined by a starting and an end point;

a system processor programmed to retrieve from the database the identified first product component and automatically replicate the first product component in a manner that fits the first product component to the indicated region of the two-dimensional design space, including automatically populating the indicated region of the two-dimensional design space with any associated hardware for connecting or providing structural support to the replicated product components required to fit the first product component within the indicated region of the design space;

automatically constrain the vertical position of the first product component and generate a three-dimensional view that is fully consistent with the two-dimensional view, including automatically populating the corresponding indicated region in the three-dimensional design space with any associated hardware for connecting or providing structural support to the replicated product components required to fit the first product component within the indicated region of the design space;

retrieve from the database a second product component from a different product line and automatically replicating the second product component in a manner that fits the second product component to the indicated region of the design space previously occupied by the first product component, including automatically populating the indicated region of the design space with any associated hardware for connecting or providing structural support required to fit the second product component within the indicated region of the design space; and automatically constrain the vertical position of the second product component and generate a three-dimensional view that is fully consistent with the two-dimensional view, including automatically populating the corresponding indicated region in the three-dimensional design space with any associated hardware for connecting or providing structural support to the replicated product components required to fit the second product component within the indicated region of the design space.

\* \* \* \* \*

UNITED STATES PATENT AND TRADEMARK OFFICE
CERTIFICATE OF CORRECTION

| | | |
|---|---|---|
| PATENT NO. | : 8,510,672 B2 | Page 1 of 1 |
| APPLICATION NO. | : 12/444886 | |
| DATED | : August 13, 2013 | |
| INVENTOR(S) | : Loberg | |

It is certified that error appears in the above-identified patent and that said Letters Patent is hereby corrected as shown below:

On Title Page 2 Column 1
Line 16, change "3/2000" to --6/2000--
Line 46, add Reference 2005/0081161 A1 07/2004 Takagaki In the Specification
Column 7
Lines 13-14, change "the user can change make choices to change" to --the user can make choices to change--
Line 37, change "is selected" to --are selected--
Line 48, change "product assembly" to --product assembly *112a*--

Column 8
Lines 9-10, change "drawing/design (or CAD application, as well as" to --drawing/design (or CAD) application, as well as--

Column 12
Line 8, change "surface *120d* to floor" to --surface *122d* to a floor--
Line 9, change "surface *120d*" to --surface *122d*--
Line 15, change "C-shaped support" to --C-shaped support.--
Line 30, change "the adjacent items to resize" to --to resize the adjacent items--

Column 14
Line 1, change "interface 110" to --interface 100--

Column 16
Line 52, change "illustrates" to --illustrate--

Signed and Sealed this
Twenty-eighth Day of January, 2014

Michelle K. Lee
*Deputy Director of the United States Patent and Trademark Office*